June 7, 1966 R. A. HENLE 3,255,365

PNP-NPN TRANSISTOR BISTABLE CIRCUITS

Filed Dec. 18, 1953 3 Sheets-Sheet 1

*INVENTOR.*
ROBERT A. HENLE
*BY* P. E. Henninger
ATTORNEY

*INVENTOR.*
ROBERT A. HENLE
BY P. E. Henninger
ATTORNEY

PNP-NPN TRANSISTOR BISTABLE CIRCUITS

Filed Dec. 18, 1953 3 Sheets-Sheet 3

INVENTOR.
ROBERT A. HENLE
BY P. E. Henninger
ATTORNEY

United States Patent Office 3,255,365
Patented June 7, 1966

3,255,365

PNP-NPN TRANSISTOR BISTABLE CIRCUITS

Robert A. Henle, Hyde Park, N.Y., assignor to International Business Machines Corporation, New York, N.Y., a corporation of New York Filed Dec. 18, 1953, Ser. No. 399,093
13 Claims. (Cl. 307—88.5)

This invention relates to switching circuits and particularly to switching circuits of the types known as trigger and latching circuits. A particular feature of the invention is the employment of transistors in such circuits.

A switching circuit may be defined as a circuit having two stable output states which are characterized by substantially separated values of current or voltage. The particular one of the two output states in which the circuit operates at any given time is determined by an input signal or signals supplied at that time or previously to the input terminals of the circuit. The circuit changes suddenly, i.e., it switches, from one output state to the other in a time interval which is so small as to be negligible.

A trigger circuit may be defined as a switching circuit having a single set of input terminals, and in which an input signal of one polarity is effective to establish one output state, and an input signal of the opposite polarity is effective to establish the other output state. Either output state, when established, continues until a signal of the opposite polarity is received.

A latching circuit may be defined as a circuit having two sets of input terminals. A signal impressed on one set of input terminals is effective to establish one of the output states, and a signal impressed on the other set of input terminals establishes the other output state. Commonly, both signals are of the same polarity. Either output state, once established, continues until a signal is received from the opposite set of input terminals.

The foregoing types of circuits are known in the form of vacuum tube circuits, utilizing typically either diodes or triodes. Some such circuits are also known using semiconductor diodes.

Transistors have recently come into use as relay devices broadly capable of functions similar to those of electromagnetic relays, vacuum tubes, and other devices which respond to a small input signal to control a larger output signal. Transistor current and potential characteristics are quite different from those of electromagnetic relays and of vacuum tubes, and consequently transistors cannot be directly substituted for those other relay devices in any given circuit. While the ultimate function of such a circuit using one or more transistors may be broadly equivalent to the ultimate function of a vacuum tube circuit, the structures of the two circuits are typically quite different.

Transistors are preferred to vacuum tubes and electromagnetic relays for many circuit applications because of their lower power requirements, small space requirements and comparatively rapid response to input signals. Such advantages of transistors are particularly desirable in the case of circuits used in high speed computers, which may require thousands of such relay devices. The advantages to be gained with respect to the power requirements and space requirements from the use of transistors in such apparatus as opposed to vacuum tubes are very obvious.

Transistors may be classified as either point contact transistors or junction transistors. Point contact transistors have substantially higher current amplification characteristics than junction transistors, and have for that reason been preferred to junction transistors for use in switching circuits.

On the other hand, junction transistors have certain advantages over point contact transistors for use in switching circuits. Among these advantages are that the circuits operate at a much lower power level than even the point contact transistors, and the supply voltages required are lower. Furthermore, the circuits are less critical with respect to transistor characteristics, i.e., with respect to variations in characteristics between transistors of the same design, and also with respect to variations with time in the characteristics of a particular transistor.

An object of the present invention is to provide novel switching circuits. A further object is to provide novel switching circuits employing junction transistors. Other objects are to provide novel trigger and latching circuits.

The foregoing objects are attained by connecting two junction transistors having complementary symmetry (i.e., one NPN transistor and one PNP transistor, in a series loop circuit). The output terminals of each transistor are connected to the input terminals of the other to form the loop. A signal impressed on the input terminals on one point in the loop is transmitted around the loop, to the output terminals and then is fed back, continuing around the loop, to the input terminals, where the feedback simulates the input signal, and effectively establishes stable conditions at the output terminals. These conditions continue until another input signal is received which upsets the established stable situation in the loop and initiates a different stable situation.

Two of the four circuits described specifically below have two sets of input terminals, and operate as latching circuits, being changed from one set of operating conditions to the other by signals from the opposite sets of input terminals. Each of the other two circuits is provided with only a single set of input terminals, and is changed from one set of operating conditions to the other by signals of opposite polarities. These circuits may therefore be described as trigger circuits.

Other objects and advantages of the invention will become apparent from a consideration of the following specification, taken together with the accompanying drawings.

FIGS. 1 TO 3

Figure 1:
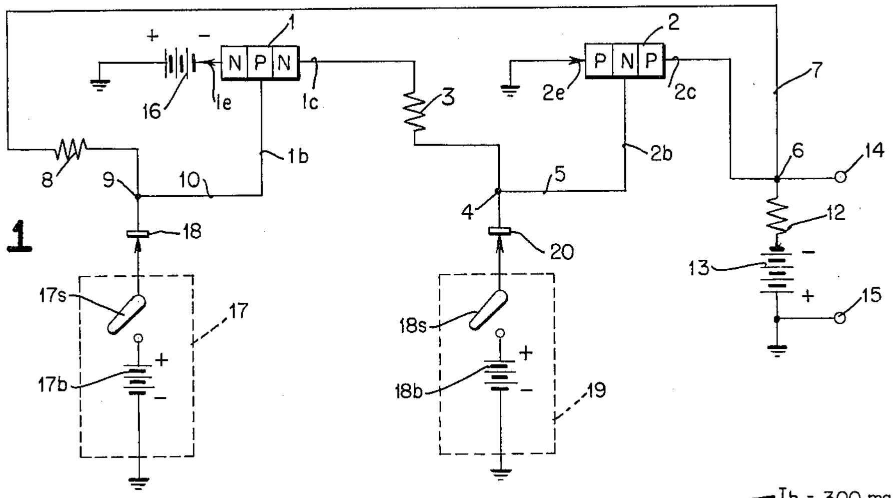
FIG. 1 is a wiring diagram of a latching circuit embodying the invention.

FIG. 1 shows a latching circuit including an NPN transistor generally indicated at 1 and having a base electrode 1*b*, an emitter electrode 1*e* and a collector electrode 1*c*. A PNP transistor 2 has a base electrode 2*b*, an emitter electrode 2*e* and a collector electrode 2*c*.

The base-collector impedances of the two transistors 1 and 2 are connected in a loop circuit which may be traced from the base electrode 1*b* through the base-collector impedance of transistor 1 to collector 1*c*, thence through a resistor 3, a junction 4, a wire 5, the base-collector impedance of transistor 2, a junction 6, a wire 7, a resistor 8, a junction 9 and a wire 10, back to the base electrode 1*b*.

Connected in series between junction 6 and ground are a load resistance 12 and a battery 13 which biases the junction 6 negatively with respect to ground. Output terminals 14 and 15 are connected respectively to the junction 6 and to ground.

The emitter electrode 1*e* of transistor 1 is connected through a biasing battery 16 to ground. The emitter electrode 2*e* of transistor 2 is connected directly to ground.

A signal generator 17, hereinafter termed the "set" signal generator, is connected between ground and the base electrode 1*b*. A semi-conductor diode or other equivalent asymmetric unit 18 is connected between the signal generator 17 and base 1*b* so that current may flow from the generator 17 only in the direction toward the base 1*b* and not in the direction through the generator 17 to ground.

The signal generator 17 is illustrated as comprising a battery 17*b* and a single-pole, single-throw switch 17*s*, movable between the open position shown and a closed position in which the battery 17*b* delivers a potential to the junction 9.

Another signal generator 19 is connected through the asymmetric unit 20 to the junction 4 and has its other terminal connected to ground. The signal generator 19 is shown as comprising a switch 18*s* and a battery 18*b*. The mechanical operation of the two signal generators 17 and 19 is the same.

While I have illustrated, by way of example, certain specific signal generator structures, it will be readily understood by those skilled in the art that other electrically equivalent signal generators may be used in place of those illustrated, and that my invention is in no way limited to the specific signal generator structures shown and described.

Figure 2:
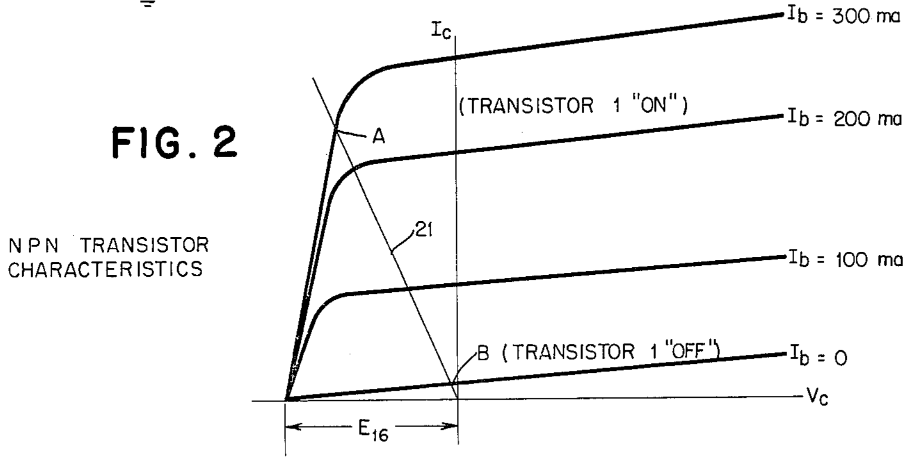
FIG. 2 is a graphical illustration of the output characteristics of the NPN transistor in the circuit of FIG. 1.

FIG. 2 shows a family of collector potential-current ($V_c$–$I_c$) characteristics for an NPN transistor such as transistor 1, each taken with a fixed value of base current $I_b$, as indicated, and an emitter biased negatively by $E_{16}$. On this family of characteristics there is superimposed a load line 21, whose slope is determined by the sum of the impedances of resistor 3 and the base input impedance of the PNP transistor, and whose location is determined by the fact that it passes through the origin. The shift of the common zero current point of all the curves from the origin is determined by the potential of battery 16, as indicated by the legend "$E_{16}$" in FIG. 2.

Figure 3:
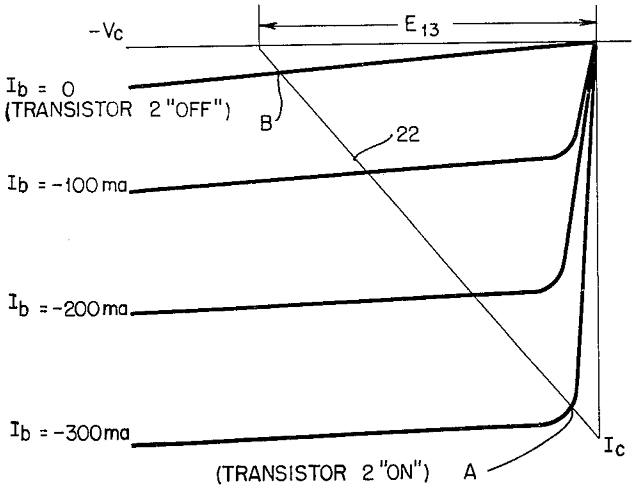
FIG. 3 is a graphical illustration of the output characteristics of the PNP transistor in the circuit of FIG. 1.

FIG. 3 shows a similar family of collector potential-current ($V_c$–$I_c$) characteristics for a PNP transistor such as transistor 2. Each curve of the family is taken for a fixed value of base current $I_b$, as shown, and a grounded emitter. There is superimposed on this family of characteristics a load line 22, whose slope is determined by the impedance of resistor 12 and whose location is determined by the collector potential (i.e., the potential of battery 13) when the collector current is zero.

OPERATION OF FIG. 1

In order to facilitate an understanding of the operation of this circuit, specific values of potential for the batteries 13, 16, 17*b* and 18*b* are assumed below. It should be readily understood by those skilled in the art that the invention is not limited to the use of batteries of these specific potentials. The potentials used in any given case will be determined by the impedances of the transistors and other circuit elements.

The circuit has two stable output states, hereinafter referred to as the "ON" and "OFF" states. The ON (high $I_c$) state of transistor 1 is indicated in FIG. 2 at the point A, while its OFF (low $I_c$) is indicated at the point B. Similarly, in FIG. 3, the ON state of transistor 2 is indicated at the point A′ and the OFF state of transistor 2 is indicated at the point B′.

Assume that: the terminal potential of battery 13 is 5 volts and that of battery 16 is 2½ volts; both switches 17*s* and 18*s* are open; and both transistors are in their OFF states. The collector of transistor 2 in the OFF state is at −5 volts. This will hold the base of transistor 1 at approximately −5 volts. Since the emitter of transistor 1 is held at −2.5 volts by battery 16, the N-P junction between emitter and base is biased 2.5 volts in the back direction and little or no current flows through it. Therefore the collector to base impedance of transistor 1 is very nearly the back impedance of the collector N-P junction.

Considering transistor 2, the base current is nearly zero because of the large impedance at the collector of transistor 1. Therefore the collector current is nearly zero and the potential of collector 2*c* with respect to ground is substantially that of battery 13 (−5 volts).

Since the base currents of transistors 1 and 2 are both essentially zero, no current is flowing in the loop circuit.

Under these conditions, let it be assumed that switch 17*s* is closed, thereby connecting the positive terminal of battery 17*b*, which has a potential of 3 volts, to the base 1*b* of transistor 1. When battery 17*b* is so connected, it is in series aiding with battery 16 in the base-emitter loop of transistor 1. It therefore produces a substantial increase in emitter current and in the base current of transistor 1. The collector-emitter impedance of transistor 1 becomes very low and the collector current consequently increases, the transistor 1 then operating at the point A in FIG. 2. The potential ($V_c$) of collector 1*c* becomes more negative, and this negative potential is transmitted to the base 2*b* of transistor 2. When the potential of base 2*b* becomes more negative, a substantial current flows from the grounded emitter 2*e*, and the collector current is increased, the operation shifting from point B′ to point A′ in FIG. 3. The collector-base impedance of transistor 2 becomes very low and the potential of collector 2*c* and hence of junction 6 becomes more positive, due to the increased current flow through resistor 12, and the consequent increased potential drop across it. The several impedances in the circuit are so proportioned that the potential of junction 6 at this time is more positive than the potential of battery 16, so that the effect of the changed potential of junction 6 is fed back through wire 7 and resistor 8 and is cumulative with the effect of generator 17.

If the switch 17*s* is then opened, the feedback potential from junction 6 in effect replaces the signal potential from generator 17 and the transistors 1 and 2 are both maintained in their ON conditions.

With the transistors in their ON conditions, let it now be assumed that switch 18*s* is closed, thereby connecting the positive terminal of battery 18*b* and the base 2*b*. Battery 18*b* has a potential of +½ volt. It is only necessary that this voltage be slightly positive with respect to ground, since the emitter 2*e* is grounded. When this positive voltage is applied to base 2*b*, it effectively cuts off the emitter current, and thereby reduces the collector current to a low value. The transistor 2 shifts from the operating point A′ back to the operating point B′ in FIG. 3. The junction 6 then takes up a potential substantially equal to the potential of the negative terminal of battery 13. This potential is transmitted through wire 7 and resisor 8 to the base 1*b* of transistor 1, substantially cutting off the flow of base current through that transistor and causing it to shift to operating point B of FIG. 2. The emitter current of the transistor 1 is substantially cut off at the same time, so that the collector current drops to a very low value. Both transistors 1 and 2 are then in their OFF conditions.

It may be seen from the foregoing that a positive signal supplied from generator 17 shifts the circuit from its OFF to its ON condition and that it remains in the ON state until a signal is received from the generator 19. When the latter signal is received, the circuit is restored to its OFF state and remains there until another signal is received from generator 17. The circuit is therefore particularly suited for use in pulsing arrangements, wherein the signals are short pulses of electric current. In the event that signals are received from both the generators 17 and 19 at the same time, the stronger signal will predominate. By suitably proportioning the signals, as by proportioning the voltages of the batteries **17*b* and 18*b***, either one can be made to predominate as desired.

Reviewing the operation of the circuit of FIG. 1 from another angle, it may be seen that the application of a positive signal to the input (base) of transistor 1 results in the application of a negative signal to the input (base) of transistor 2 which in turn feeds back a positive signal to the input of transistor 1. Because the two transistors have complementary symmetry, the effect of the positive signal on transistor 1 is similar to that of a negative signal on transistor 2 and vice versa. Similarly, during the resetting operation a positive signal supplied to the input of FIG. 2 results in a negative signal being fed back to the input of transistor 1, which in turn results in a further positive signal being supplied to the input of transistor 2.

FIGS. 4 TO 6

Figure 4:
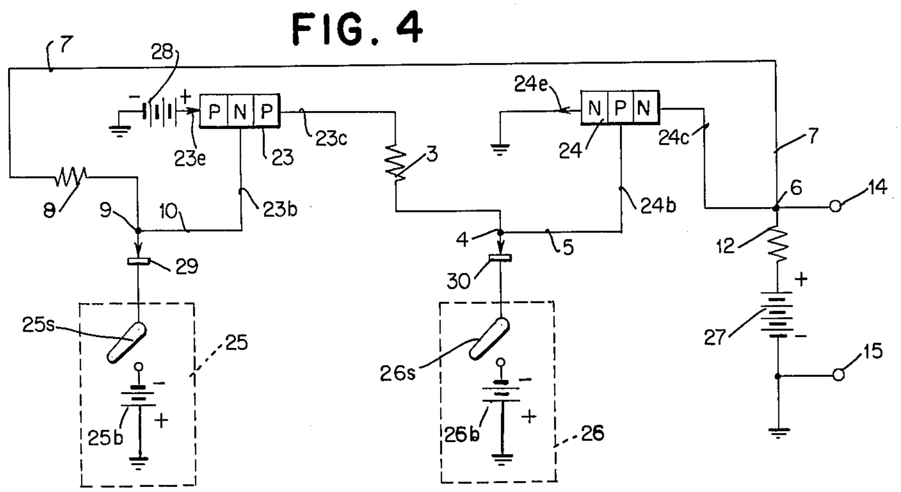
FIG. 4 is a wiring diagram of a modified form of circuit embodying the invention.

These figures illustrate a circuit similar to that of FIG. 1, except that the NPN transistor 1 of FIG. 1 is replaced by a PNP transistor 23. Similarly, the PNP transistor 2 of FIG. 1 is replaced by an NPN transistor 24. The polarities of all the batteries are reversed in FIG. 4 from the polarities shown in FIG. 1, since the conductivities of the transistors are reversed. Otherwise, the construction and operation of the circuit of FIG. 4 is analogous to that of FIG. 1. Consequently, the circuit of FIG. 4 will be described only briefly.

Transistor 23 has a base electrode **23*b*, an emitter electrode 23*e* and a collector electrode 23*c*. Transistor 24 has a base electrode 24*b*, an emitter electrode 24*e* and a collector electrode 24*c*. The resistors 3, 8 and 12** correspond exactly to their counterparts in FIG. 1 and have therefore been given the same reference numerals. The same applies to various conductors, junctions, and the output terminals.

Signal generators 25 and 26 of FIG. 4 correspond respectively to the signal generators 17 and 19 of FIG. 1, except that the polarity of the batteries **25*b* and 26*b* is reversed. Batteries 27 and 28 correspond respectively to batteries 13 and 16 of FIG. 1, except that their polarities are reversed. Asymmetric units 29 and 30 also correspond respectively to asymmetric units 18 and 20** of FIG. 1 except that their polarities are reversed.

Figure 5:
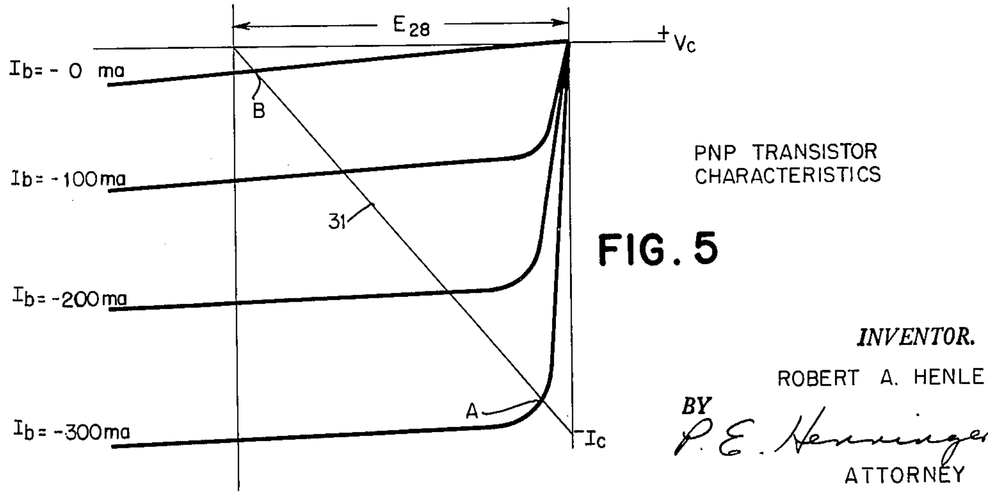
FIG. 5 is a graphical illustration of the output characteristics of the NPN transistor in the circuit of FIG. 4.

FIG. 5 shows a family of collector potential-current characteristics ($V_c$–$I_c$) of the transistor 23, each curve of the family being taken at a specific value of base current, and an emitter biased by $E_{28}$, as shown. There is superimposed on this family of characteristics a load line 31, whose slope is determined by the sum of the impedance of resistor 3 and the base input impedance of transistor 24, and whose location is determined by the fact that it passes through the origin. The location of the origin with respect to the common zero collector current point on all the curves is determined by the potential of the battery 28, as indicated by the legend $E_{28}$ in FIG. 5. The operating points A and B shown in FIG. 5 correspond to the operating points A and B in FIG. 2.

Figure 6:
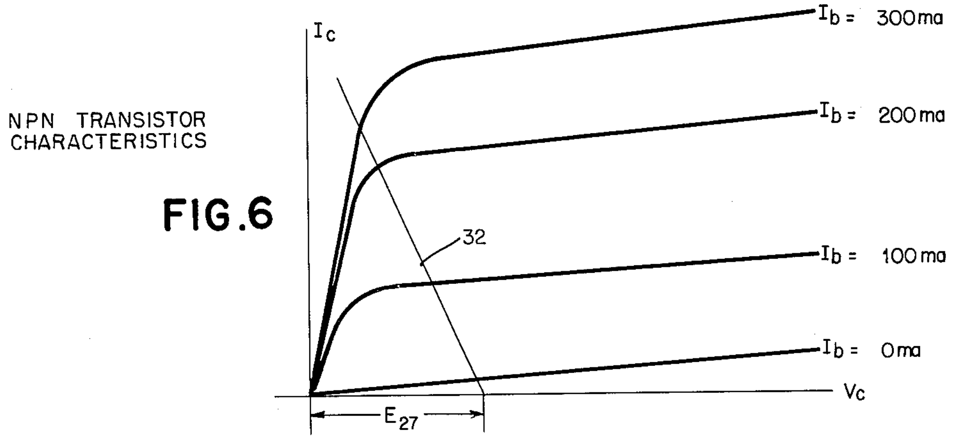
FIG. 6 is a graphical illustration of the output characteristic of the NPN transistor in the circuit of FIG. 4.

FIG. 6 shows a family of collector potential-current ($V_c$–$I_c$) characteristics of the NPN transistor 24 in FIG. 4. Each curve of the family is taken for a constant value of base current as indicated by the legend in the drawings, and a grounded emitter. There is superimposed on this family of curves a load line 32, whose slope is determined by the impedance of resistor 12 and whose location is determined by the voltage of the battery 27, as indicated by the legend $E_{27}$ in the drawing.

It is considered that the circuit of FIG. 4 and its operation may be adequately understood, by reference to the detailed explanation of the operation of the analogous circuit of FIG. 1, set forth above.

FIGS. 7 TO 9

These figures illustrate a trigger circuit embodying the invention.

Figure 7:
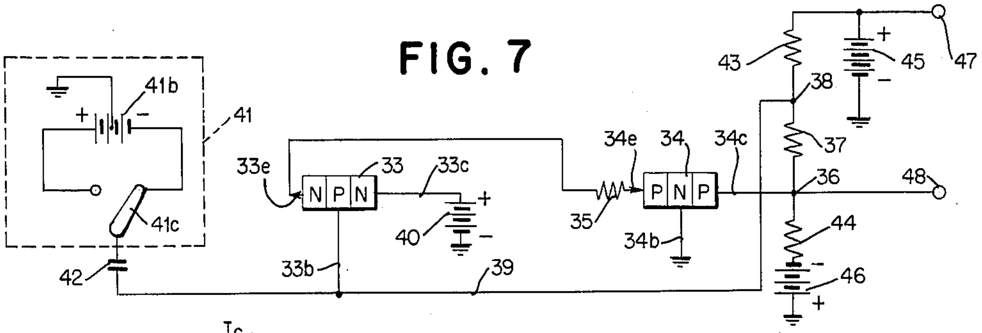
FIG. 7 is a wiring diagram of a trigger circuit embodying the invention.

There is shown in FIG. 7 an NPN transistor 33 having a base electrode **33*b*, an emitter electrode 33*e* and a collector electrode 33*c*. A PNP transistor 34 has a base electrode 34*b*, an emitter electrode 34*e* and a collector electrode 34*c*. The emitter-base impedance of transistor 33 is connected in series with the emitter-collector impedance of transistor 34 in a series loop circuit which may be traced from the base electrode 33*b* through emitter 33*e*, resistor 35, emitter 34*e*, collector 34*c*, junction 36, resistor 37, junction 38, and wire 39 back to base 33*b*. A biasing battery 40 is connected between collector 33*c* and ground, and its polarity is arranged to bias the collector 33*c* positively with respect to ground. The base 34*b* of transistor 34 is connected directly to ground. A signal generator 41 is connected through a condenser 42 to the series loop circuit at the base 33*b* of transistor 33**.

The signal generator 41 is illustrated as including a split battery **41*b* having a grounded center tap and a single-pole, double-throw switch 41*c*** movable between two positions in which it engages the opposite terminals of the battery. Other electrically equivalent generators may alternately be used.

The resistor 37 forms part of a voltage divider network which also includes two resistors 43 and 44 and two batteries 45 and 46. The junction 38 is connected through resistor 43 to the positive terminal of battery 45 while junction 36 is connected through resistor 44 to the negative terminal of battery 46. The opposite terminals of the batteries 45 and 46 are grounded. Output terminals 47 and 48 are connected respectively to the positive terminal of battery 45 and to the junction 36.

Figures 8, 9:
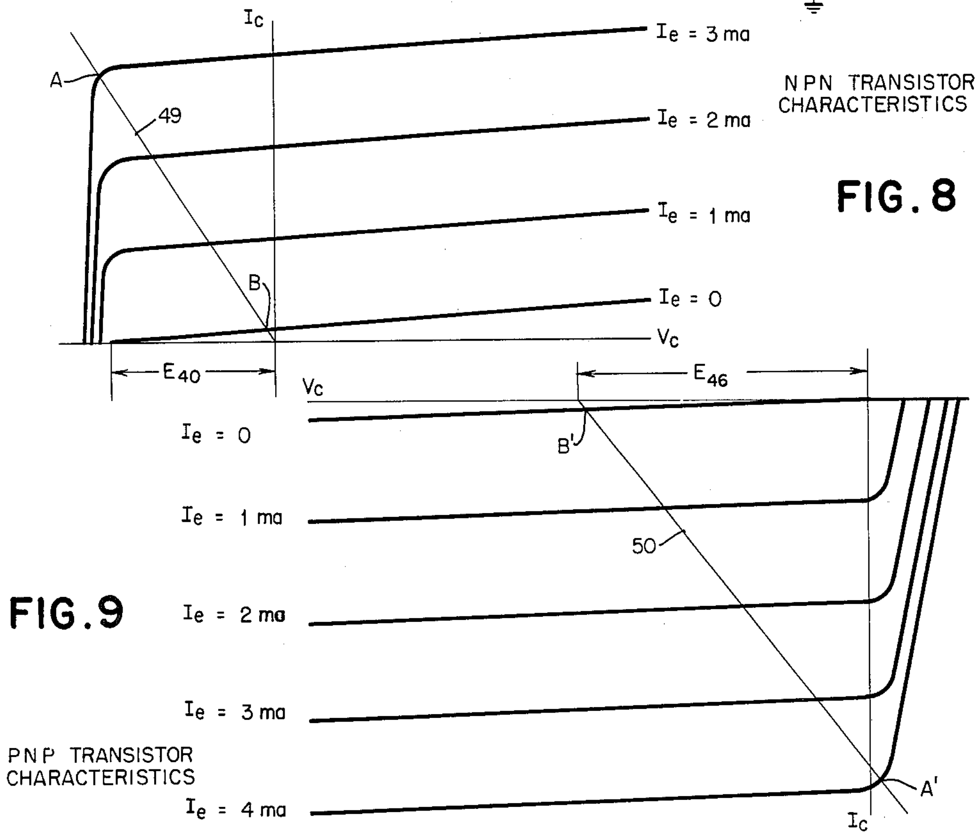
FIG. 8 is a graphical illustration of the output characteristics of the PNP transistor in FIG. 7.
FIG. 9 is a graphical illustration of the output characteristics of the PNP transistor in FIG. 7.

FIG. 8 shows a family of collector potential-current characteristics ($V_c$–$I_c$) for the transistor 33 of FIG. 7. Each curve of this family is taken for a fixed value of emitter current ($I_e$) as indicated in the drawing, and for an emitter biased by a potential $E_{40}$, as shown. There is superimposed on this family of curves a load line 49, whose slope is determined by the sum of the impedances of resistor 35 and the emitter input impedance of the PNP transistor, and whose location is determined by the fact that it passes through the origin.

FIG. 9 shows a family of collector potential-current characteristics ($V_c$–$I_c$) for the PNP transistor 34 of FIG. 7. Each curve in this family is taken for a fixed value of emitter current, as indicated by the legend in the drawing, and grounded base. There is superimposed on this family of characteristics a load line 50, whose slope is determined by the impedance of resistor 44 and whose location is determined by the potential of battery 46, as indicated by the legend $E_{46}$ in the drawing.

The resistor 35 may, if desired, be removed from its connection in series with emitter **34*e* of transistor 34, and connected instead in series with collector 33*c* of transistor 33**, without changing the essential characteristics of the circuit or its mode of operation.

OPERATION OF FIG. 7

While specific values of potential may be mentioned below in connection with particular batteries, it should be realized that these are mentioned by way of example only.

With regard to transistor 33, the base **33*b* may be considered as the input electrode, since incoming signals are received there and the emitter 33*e* may similarly be considered as the output electrode. With regard to the transistor 34, the emitter 34*e* may be considered as the input electrode and the collector 34***c* as the output electrode.

The circuit of FIG. 7 has two stable states of operation, hereinafter referred to as the "OFF" and "ON" states, or sometimes as the "A" and "B" states. In the OFF state, the output electrode current in both transistors is low and in the ON state the output current in both transistors is high.

Considering first the OFF state, the impedances of the resistors 37, 43 and 44 and the potentials of the batteries 45 and 46 are so selected that when no current is flowing through the collector 34*c*, the junction 36 is at substantially the same potential as the negative terminal of battery 46, and the junction 38 is below ground potential. This latter potential is transmitted through wire 39 to the base 33*b* of transistor 33. The emitter current of the transistor 33 is then substantially cut off, since the base 33*b* is negative and the emitter 33*e* is connected to ground through the emitter base impedance of transistor 34. Transistor 33 is then operating at point B in FIG. 8, so that its emitter current and collector current are both low. The emitter current of transistor 34 is likewise low and the base and collector currents of that transistor are low, its operating point being at B′ in FIG. 9.

When the circuit is in its ON condition, a substantial current is flowing from battery 46 through battery 40, collector 33*c*, emitter 33*e*, resistor 35, emitter 34*e*, collector 34*c* and resistor 44. The potential drop across the resistor 44 due to this current raises the potential of junction 36 to a value just below ground potential. The voltage divider resistors 43 and 37 are then effective to hold the junction 38 above ground potential. This potential is transmitted through wire 39 to base 33*b*, where it is effective to cause the flow of substantial emitter and collector currents in the transistor 33, which then operates at the point A in FIG. 8. The emitter current of transistor 34 is likewise high and the transistor 34 then operates at the point A′ in FIG. 9. The two transistors are then established in the stable ON state.

The circuit may be shifted back and forth between its OFF and ON states by applying signal pulses of the proper potentials from generator 41 through condenser 42 to the base 33*b* of transistor 33. A positive signal pulse applied to base 33*b* will shift the circuit to its ON state, since that positive signal pulse will overcome the negative signal pulse being fed back from junction 36. Similarly, a negative pulse supplied from generator 41 to base 33*b* will shift the circuit to its OFF state, since the signal pulse will overcome the positive pulse being supplied from junction 36. The output terminals 47 and 48 will have a high voltage appearing across them when the circuit is in its OFF state and a lower voltage appearing across them when the circuit is in its ON state.

While the two transistors 33 and 34 of FIG. 7 have complementary symmetry, they are connected inversely in a certain sense. That is, the emitter electrode 33*e* of transistor 33 is used as the output electrode, whereas the emitter electrode 34*e* of transistor 34 is used as the input electrode. By virtue of this arrangement, there is no phase inversion of the signal between the transistors as was the case in the circuits of FIGS. 1 and 4. On the contrary, a positive signal applied to transistor 33 results in the transmission of a positive signal to the transistor 34 and a positive feedback signal from the output of the latter transistor back to transistor 33.

FIG. 10

Figure 10:
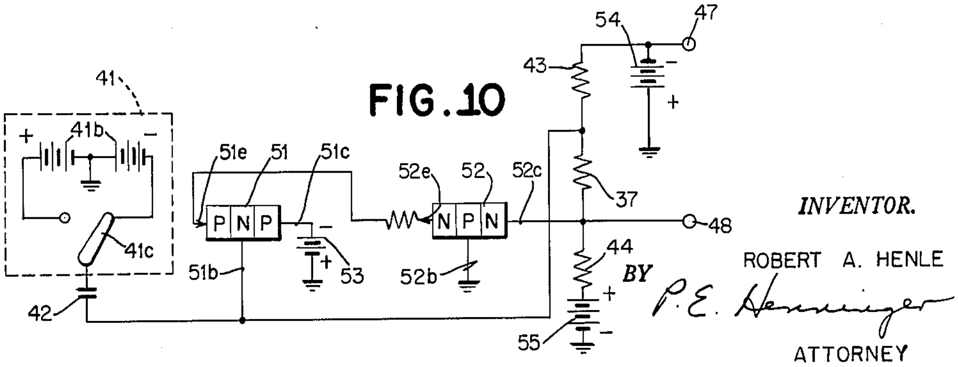
FIG. 10 is a wiring diagram of another form of trigger circuit embodying the invention.

FIG. 10 shows a circuit similar to the circuit of FIG. 7, except that the NPN transistor 33 of FIG. 7 is replaced by a PNP transistor 51. Similarly, the PNP transistor 34 of FIG. 7 is replaced by an NPN transistor 52. Since the conductivities of the two transistors are reversed, the polarities of the batteries in the circuit are likewise reversed. Those circuit elements having the same structure and function in FIGS. 7 and 10 have been given the same reference numerals and will not be further described. Batteries 40, 45 and 46 of FIG. 7 are replaced in FIG. 10 by batteries 53, 54 and 55 respectively, having respectively opposite polarities.

The operation of the circuit of FIG. 10 is entirely analogous of the circuit of FIG. 7 and will not be described in detail. Sets of characteristics comparable to those of FIGS. 8 and 9 could readily be drawn if required. These proposed sets of characteristics would compart to FIGS. 8 and 9 in the same sense that FIGS. 6 and 5, respectively, compare to FIGS. 2 and 3.

While the circuits of FIGS. 1 and 4 have been identified as latching circuits and the circuits of FIGS. 7 and 10 have been identified as trigger circuits, it will be understood by those skilled in the art that the circuits of FIGS. 1 and 4 could be transformed into trigger circuits by the substitution of a dual polarity signal generator in place of either of the two single polarity signal generators shown in those circuits. Similarly, the trigger circuits of FIGS. 7 and 10 could be transformed into latching circuits by removing the dual polarity signal generator 41 and substituting for it a single polarity signal generator and another single polarity signal generator connected to the input of the transistor 34. In this case, the polarity of the latter signal generator would have to be reversed with respect to the polarity of the first signal generator.

While I have shown and described certain preferred embodiments of my invention, other modifications thereof will readily occur to those skilled in the art and I therefore intend my invention to be limited only by the appended claims.

I claim:

1. A switching circuit comprising first and second junction transistors, each having a body of semiconductive material including a central zone of one extrinsic conductivity type and two end zones of the opposite extrinsic conductivity type, a first base electrode in ohmically conductive relation with said central zone and second and third electrodes in electrically conductive relation with said end zones, said body providing asymmetrically conductive current paths between said end zones and said central zone; said transistors having complementary symmetry in that the conductivity types of the respective zones are opposite in the two transistors; a loop circuit including means connecting a first one of said asymmetrically conductive paths between the central zone and one end zone of one transistor in series with at least a second one of said asymmetrically conductive paths between the central zone and one end zone of the other transistor, said connecting means being arranged to connect said first and second paths with their polarities opposed, so that unidirectional current flowing through said loop circuit passes through one of the paths in its low impedance direction and through the other in its high impedance direction, said connecting means comprising two of the three electrodes of each transistor and a resistor connected between an electrode of one transistor and an electrode of the other transistor; output circuit means connected between a common junction and one terminal of said resistor, said output circuit means comprising load impedance means and a source of unidirectional electrical energy in series; second and third connecting means, one for each transistor, each extending between the third of the three electrodes of its associated transistor and said common junction; said source cooperating with said loop circuit and said second and third connecting means, in the absence of a substantial current flow through said resistor, to determine the bias potentials on all electrodes of said transistors so as to hold the switching circuit in a first stable state in which both said transistors are OFF, signal input means, isolating coupling means connecting said signal input means to said loop circuit at a point electrically remote from said one terminal of said resistor, said signal input means being operable at times when said switching circuit is in its OFF state to transmit to said loop circuit a signal effective to overcome the bias potential for one of said transistors to turn it ON and thereby to transmit a signal through the loop circuit to the other transistor and turn it ON, said other transistor being thereupon effective to transmit around the loop circuit a signal effective to hold said one transistor ON after the signal from the signal input means terminates, so that a second stable state of the switching circuit is established in which both transistors are ON.

2. A switching circuit as defined in claim 1, including additional signal input means operable when said switching circuit is in its ON state to transmit to said loop circuit a blocking signal effective to turn one of said transistors OFF, said one transistor being thereupon effective to transmit through the loop circuit a signal effective to turn the other transistor OFF, said other transistor being thereupon effective to transmit around the loop circuit a signal effective to hold said one transistor OFF after the signal from said additional signal input means terminates, thereby establishing the switching circuit in said first stable state.

3. A switching circuit as defined in claim 2, in which said signal input means and said additional signal input means are respectively connected to the base electrodes of the two transistors.

4. A switching circuit as defined in claim 2, in which said signal input means and said additional signal input means are both connected to the base electrode of one of the transistors, and are respectively effective to supply signals of opposite polarities.

5. A switching circuit as defined in claim 1, in which said loop circuit consists of said first and second asymmetrically conductive transistor paths, said resistor and a second resistor, each resistor being connected between the two transistor paths.

6. A switching circuit as defined in claim 1, in which said resistor is common to said loop circuit and said output circuit means, and said output circuit means also includes a second resistor and a second source of unidirectional energy having a polarity opposed to said first source and having one terminal connected to said common junction, said resistors and said load impedance means defining a voltage divider connected in series between said two sources.

7. A switching circuit as defined in claim 1, in which the reversely biased electrode of each transistor is connected to the base electrode of the other transistor, and one of said second and third connecting means includes means to bias its associated third electrode in a sense to increase the current flow therethrough in the low impedance direction of its associated asymmetrically conductive path.

8. A switching circuit as defined in claim 1, in which said source of energy is effective to bias one of said second and third electrodes of one of said transistors to serve as a collector electrode; one of said second and third connecting means associated with the other transistor includes means to bias the associated electrode of the other transistor to serve as a collector electrode; and the emitter electrodes of the two transistors are connected together.

9. A transistor trigger circuit comprising a junction transistor of NPN type, a junction transistor of PNP type, each of said transistors having an emitter electrode, a collector electrode and a base electrode, a first resistor, first circuit means providing a direct current connection between the base electrode of said NPN transistor to the collector electrode of said PNP transistor through said first resistor, a second resistor, second circuit means providing a direct current connection between the base electrode of said PNP transistor to the collector electrode of said NPN transistor through said second resistor, said first and second circuit means comprising the sole connections between said base and collector electrodes, respectively, means for biasing both junctions of each of said transistors in normally non-conducting condition, and means for biasing both said transistors to conducting condition comprising means for applying a control pulse to the base electrode of said PNP transistor.

10. A switching circuit comprising two transistors having complementary symmetry, each transistor comprising an emitter electrode, a collector electrode and a base electrode; and electric circuit means interconnecting the electrodes of both transistors, said electric circuit means comprising means for supplying operating potentials to two electrodes of each transistor, means coupling said emitter electrodes externally only conductively and only to each other, cross-coupling means connecting the collector of one transistor to the base of the other transistor, and at least one signal input connected between the base and collector electrodes of one transistor and adapted to produce input signal pulses of limited duration, said coupling means, said cross-coupling means, and said connections cooperating to switch the transistors between two stable states of conductivity in response to said input signal pulses.

11. A bistable circuit comprising two transistors having complementary symmetry, each transistor having an input electrode; and electric circuit means interconnecting the electrodes of both transistors, said electric circuit means comprising means for supplying operating potentials to two electrodes of each transistor, an output electrode and a common electrode, at least one signal input means connected between the input and common electrodes of one transistor and adapted to produce signal current pulses of limited duration, first and second cross-coupling means connecting the respective output electrodes to the input electrodes of the opposite transistors, each said cross-coupling means being effective when the transistor connected to its associated output electrode shifts from a low current to a high current condition to transfer to the associated input electrode of the other transistor a signal tending to shift the other transistor from a low current to a high current condition, said signal input means cooperating with said cross-coupling means to switch the two transistors substantially simultaneously between a first stable output state in which both transistors carry a relatively high current and a second stable output state in which both transistors carry a relatively low current, said cross-coupling means cooperating in the absence of input signals to maintain both transistors in the stable output state established by the last input signal pulse.

12. A bistable circuit comprising two transistors having complementary symmetry, each transistor having a base electrode, a collector electrode and an emitter electrode; and electric circuit means interconnecting the electrodes of both transistors, said electric circuit means comprising means for supplying operating potentials to two electrodes of each transistor, at least one signal input means connected between the emitter and base electrodes of one transistor and adapted to produce signal current pulses of limited duration, first and second cross-coupling means connecting the respective collector electrodes to the base electrodes of the opposite transistors, each said cross-coupling means being effective when the transistor connected to its associated collector electrode shifts from a low current to a high current condition to transfer to the base electrode of the other transistor a signal tending to shift the other transistor from a low current to a high current condition, said signal input means cooperating with said cross-coupling means to switch the two transistors substantially simultaneously between a first stable output state in which both transistors carry a relatively high current and a second stable output state in which both transistors carry a relatively low current, said cross-coupling means cooperating in the absence of input signals to maintain both transistors in the stable output state established by the last input signal pulse.

13. A bistable circuit comprising two transistors having complementary symmetry, each transistor having a base electrode, a collector electrode and an emitter electrode; and electric circuit means interconnecting the electrodes of both transistors, said electric circuit means comprising means for supplying operating potentials to two electrodes of each transistor, at least one signal input means connected between the collector and base electrodes of one transistor and adapted to produce signal current pulses of limited duration, first cross-coupling means connecting the emitter electrodes of the two transistors and second cross-coupling means connecting the collector electrode of one transistor and the base electrode of the other transistor, each said cross-coupling means being effective when one transistor shifts from a low current to a high current condition to transfer to the other transistor a signal tending to shift the other transistor from a low current to a high current condition, said signal input means cooperating with said cross-coupling means to switch the two transistors substantially simultaneously between a first stable output state in which both transistors carry a relatively high current and a second stable output state in which both transistors carry a relatively low current, said cross-coupling means cooperating in the absense of input signals to maintain both transistors in the stable output state established by the last input signal pulse.

References Cited by the Examiner

UNITED STATES PATENTS

| | | | |
|---|---|---|---|
| 2,531,076 | 11/1950 | Moore | 307—88.5 |
| 2,605,306 | 7/1952 | Eberhard | 307—88.5 |
| 2,644,897 | 7/1953 | Lo | 307—88.5 |
| 2,655,609 | 10/1953 | Schockley | 307—88.5 |
| 2,663,800 | 12/1953 | Herzog | 307—88.5 |
| 2,665,845 | 1/1954 | Trent | 307—88.5 X |
| 2,718,613 | 9/1955 | Harris | 307—88.5 |
| 2,733,304 | 1/1956 | Koenig | 179—171 |

OTHER REFERENCES

IRE Proceedings, June 1953, pp. 708–717, "A Study of Transistor Circuits for Television," by Sziklai et al.

GEORGE N. WESTBY, *Primary Examiner.*

SIMON YAFFEE, ARTHUR GAUSS, JOHN W. HUCKERT, *Examiners.*

C. R. CAMPBELL, *Assistant Examiner.*